(12) United States Patent
Xu et al.

(10) Patent No.: US 11,721,542 B2
(45) Date of Patent: Aug. 8, 2023

(54) DUAL PLASMA PRE-CLEAN FOR SELECTIVE GAP FILL

(71) Applicant: Applied Materials, Inc., Santa Clara, CA (US)

(72) Inventors: Yi Xu, San Jose, CA (US); Yufei Hu, Fremont, CA (US); Kazuya Daito, Milipitas, CA (US); Yu Lei, Belmont, CA (US); Dien-Yeh Wu, San Jose, CA (US); Jallepally Ravi, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/101,077

(22) Filed: Nov. 23, 2020

(65) Prior Publication Data
US 2021/0159070 A1 May 27, 2021

Related U.S. Application Data

(60) Provisional application No. 63/042,275, filed on Jun. 22, 2020, provisional application No. 62/960,293,
(Continued)

(51) Int. Cl.
*H01L 21/02* (2006.01)
*H01L 21/67* (2006.01)
(Continued)

(52) U.S. Cl.
CPC ...... *H01L 21/02068* (2013.01); *B08B 7/0035* (2013.01); *H01J 37/32357* (2013.01);
(Continued)

(58) Field of Classification Search
CPC ......... H01L 21/02068; H01L 21/67028; H01L 21/76879; H01L 21/02063;
(Continued)

(56) References Cited

U.S. PATENT DOCUMENTS 5,091,049 A 2/1992 Campbell et al.
5,710,486 A 1/1998 Ye et al.
(Continued)

FOREIGN PATENT DOCUMENTS

JP 2009238878 A 10/2009
KR 100653217 B1 12/2006

OTHER PUBLICATIONS

PCT International Search Report and Written Opinion in PCT/US2020/061759 dated Mar. 18, 2021, 9 pages.
(Continued)

*Primary Examiner* — Erin F Bergner
(74) *Attorney, Agent, or Firm* — Servilla Whitney LLC

(57) ABSTRACT

Methods for pre-cleaning substrates having metal and dielectric surfaces are described. A substrate comprising a surface structure with a metal bottom, dielectric sidewalls, and a field of dielectric is exposed to a dual plasma treatment in a processing chamber to remove chemical residual and/or impurities from the metal bottom, the dielectric sidewalls, and/or the field of the dielectric and/or repair surface defects in the dielectric sidewalls and/or the field of the dielectric. The dual plasma treatment comprises a direct plasma and a remote plasma.

9 Claims, 3 Drawing Sheets

Related U.S. Application Data filed on Jan. 13, 2020, provisional application No. 62/941,148, filed on Nov. 27, 2019.

(51) Int. Cl.
  *H01J 37/32* (2006.01)
  *B08B 7/00* (2006.01)
  *H01L 21/768* (2006.01)

(52) U.S. Cl.
  CPC .. *H01J 37/32422* (2013.01); *H01J 37/32926* (2013.01); *H01L 21/67028* (2013.01); *H01J 2237/335* (2013.01); H01L 21/76879 (2013.01)

(58) Field of Classification Search
  CPC ... H01L 21/76814; B08B 7/0035; B08B 7/00; H01J 37/32357; H01J 37/32422; H01J 2237/335
  See application file for complete search history.

(56) References Cited

U.S. PATENT DOCUMENTS

| | | | |
|---|---|---|---|
| 6,124,003 A | | 9/2000 | Mikami et al. |
| 6,153,530 A | * | 11/2000 | Ye .................... H01L 21/02071 438/720 |
| 6,835,278 B2 | | 12/2004 | Selbrede |
| 7,294,205 B1 | | 11/2007 | Ravi et al. |
| 7,977,249 B1 | | 7/2011 | Liu et al. |
| 9,362,130 B2 | | 6/2016 | Ingle et al. |
| 9,502,218 B2 | | 11/2016 | Chen et al. |
| 10,256,079 B2 | | 4/2019 | Lubomirsky et al. |
| 10,510,553 B1 | | 12/2019 | Kuo et al. |
| 11,195,696 B2 | | 12/2021 | Shin et al. |
| 2002/0029747 A1 | | 3/2002 | Powell et al. |
| 2002/0073925 A1 | | 6/2002 | Noble et al. |
| 2004/0161942 A1 | * | 8/2004 | Tabaru .............. H01L 21/02063 438/710 |
| 2004/0194890 A1 | | 10/2004 | Moroz |
| 2004/0219737 A1 | | 11/2004 | Quon |
| 2005/0211170 A1 | | 9/2005 | Hanawa et al. |
| 2005/0211546 A1 | | 9/2005 | Hanawa et al. |
| 2007/0074814 A1 | | 4/2007 | Hahn et al. |
| 2008/0156771 A1 | | 7/2008 | Jeon et al. |
| 2008/0178805 A1 | | 7/2008 | Paterson |
| 2013/0319615 A1 | * | 12/2013 | Cho .................. H01L 21/31138 156/345.29 |
| 2014/0148014 A1 | | 5/2014 | You et al. |
| 2015/0090583 A1 | | 4/2015 | Kodaira et al. |
| 2015/0118862 A1 | | 4/2015 | Reilly et al. |
| 2016/0276134 A1 | | 9/2016 | Collins et al. |
| 2016/0358784 A1 | * | 12/2016 | Hudson ............. H01L 21/67069 |
| 2017/0069466 A1 | | 3/2017 | Tran et al. |
| 2017/0148630 A1 | | 5/2017 | Kim et al. |
| 2017/0229290 A1 | | 8/2017 | Kobayashi et al. |
| 2019/0198301 A1 | | 6/2019 | Ma et al. |
| 2019/0318937 A1 | | 10/2019 | Yang et al. |
| 2021/0082724 A1 | | 3/2021 | Xie et al. |
| 2022/0131071 A1 | | 4/2022 | Lill et al. |

OTHER PUBLICATIONS

PCT International Search Report and Written Opinion in PCT/US2020/061763 dated Mar. 16, 2021, 9 pages.

Non-Final Office Action in U.S. Appl. No. 17/101,074 dated Jan. 27, 2022, 10 pages.

Final Office Action in U.S. Appl. No. 17/101,074, dated Oct. 27, 2022, 8 pages.

Non-Final Office Action in U.S. Appl. No. 17/101,074, dated Dec. 2, 2022, 12 pages.

\* cited by examiner

DUAL PLASMA PRE-CLEAN FOR SELECTIVE GAP FILL

CROSS-REFERENCE TO RELATED APPLICATIONS

This application claims priority to U.S. Provisional Application No. 62/941,148, filed Nov. 27, 2019, to U.S. Provisional Application No. 62/960,293, filed Jan. 13, 2020, and to U.S. Provisional Application No. 63/042,275, filed Jun. 22, 2020, the entire disclosures of which are hereby incorporated by reference herein.

TECHNICAL FIELD

Embodiments of the disclosure generally relate to methods for filling gaps in semiconductors. In particular, embodiment of disclosure relate to methods for pre-cleaning a substrate to improve metal deposition selectivity.

BACKGROUND

Interconnect metallization is widely used in logic and memory devices. A liner film followed by a bulk-deposited CVD/PVD film is typically used for via/trench gap fill applications. However, as the feature size decreases, the via/trench structures become smaller and the volume ratio of liner film increases, making it difficult to achieve defect free and low resistivity metal gap fill.

A selective deposition process takes advantage of an incubation difference on one surface material versus another surface material during deposition. This incubation delay could be leveraged to enable bottom-up gap fill without seam/void and liner film. However, there are several challenges that prevent this technique from broader application. For example, impurities on the via bottom and dielectric surface can reduce selectivity of a selective metal growth on metal surface versus dielectric field. Current processes employing different direct plasma treatment (e.g., $H_2$ plasma and $O_2$ plasma) to clean surface contaminants (e.g., oxygen, carbon, fluorine, chlorine) can often experience the trade off between clean efficiency and selectivity: when the impurities and metal oxides are fully removed, the damaged caused by plasma would degrade the selectivity during following deposition.

In general, cleaning the metal surface efficiently while still maintaining no or minimal growth on the field is a major challenge preventing widespread use. Also, different surface structures with different etch residues or contaminants may need different pre-clean processes to enable selective growth.

Accordingly, there is an ongoing need in the art for improved methods and apparatus to pre-clean substrate surfaces for selective deposition

SUMMARY

One or more embodiments of the disclosure are directed to methods of pre-cleaning. A substrate comprising a surface structure with a metal bottom, dielectric sidewalls, and a field of the dielectric is exposed to a dual plasma treatment in a processing chamber to remove chemical residual and/or impurities from the metal bottom, the dielectric sidewalls, and/or the field of the dielectric and/or repair surface defects in the dielectric sidewalls and/or the field of the dielectric. The dual plasma treatment comprises a direct plasma and a remote plasma.

Additional embodiments of the disclosure are directed to methods of pre-cleaning. A substrate comprising a surface structure with a metal bottom, dielectric sidewalls, and a field of the dielectric is exposed to a dual plasma treatment in a processing chamber comprising a dual plasma lid to remove chemical residual and/or impurities from the metal bottom, the dielectric sidewalls, and/or the field of the dielectric and/or repair surface defects in the dielectric sidewalls and/or the field of the dielectric. The dual plasma treatment comprises a direct plasma and a remote plasma.

Further embodiments of the disclosure are directed to non-transitory computer readable medium, including instructions, that, when executed by a controller of a processing chamber, causes the processing chamber to perform operations of: exposing a substrate comprising a surface structure with a metal bottom, dielectric sidewalls, and a field of dielectric to a dual plasma treatment in a processing chamber to remove chemical residual and/or impurities from the metal bottom, the dielectric sidewalls, and/or the field of the dielectric and/or repair surface defects in the dielectric sidewalls and/or the field of the dielectric; wherein the dual plasma treatment comprises a direct plasma and a remote plasma.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
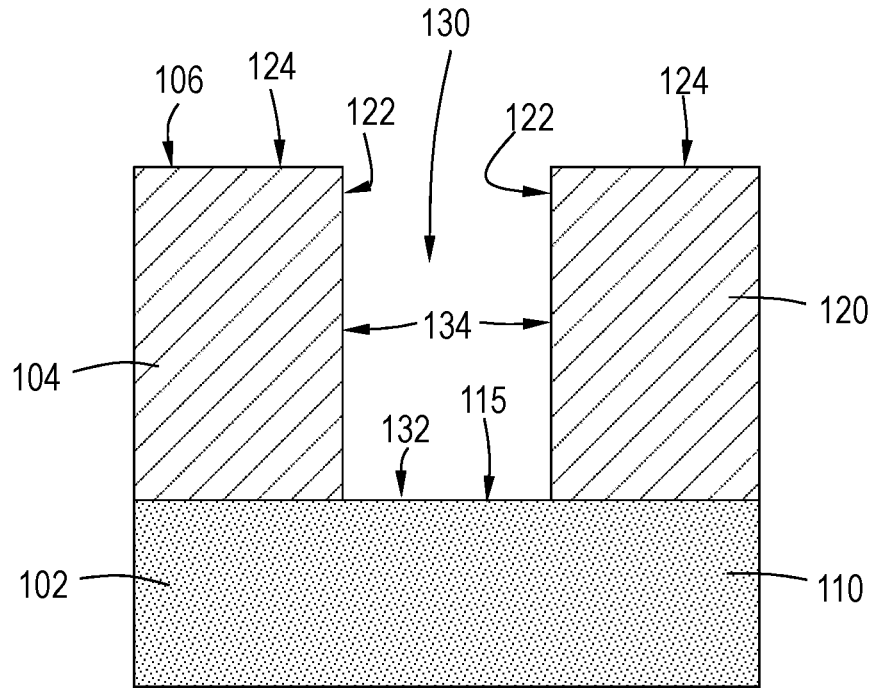
FIG. 1 shows a schematic representation of a substrate structure in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure advantageously provide methods for pre-cleaning a substrate for a wider range of structure types and selectivity windows. Some embodiments advantageously provide a dual plasma treatment with direct plasma and remote plasma, which can satisfy both pre-clean efficiency and selectivity. With the cleaning processes herein, advantageously, residual/impurities on both dielectric and metal surface from previous processes are removed. Also, metal oxides on the metal surfaces from previous processes are reduced to pure metal. Thereafter, good process performance of metal deposition is achieved, such as low line resistance, good yield and high reliability. In one or more embodiments, selectivity of tungsten (W) deposition is improved following a dual plasma treatment combining direct and remote plasma with hydrogen ($H_2$), oxygen ($O_2$), and other gases. In one or more embodiments, a dual plasma lid, which is capable to perform both direct and remote plasma, is part of a processing chamber.

Some embodiments of the disclosure provide methods for selective metal deposition processes in contacts or via bottoms which require a clean surface to start with for minimum incubation. In some embodiments, chemical residual and/or impurities, including but not limited to: metal oxide/metal nitride/metal carbide, etc., which may hinder the selective deposition process and cause significant incubation delay, are removed. Some embodiments can effectively clean metal contaminants while keeping contact/via structure preferable for selective process.

Processes of the disclosure use a dual plasma treatment combining direct and remote plasma with hydrogen ($H_2$), oxygen ($O_2$), and other gases. Use of a dual plasma lid advantageously separates ions and radicals.

During the processes, the substrate is exposed to a plasma treatment to remove chemical residual and/or impurities from the metal bottom, the dielectric sidewalls, and/or the field of the dielectric and/or repair surface defects in the dielectric sidewalls and/or the field of the dielectric. The dual plasma treatment includes one plasma that is a direct plasma and another plasma that is a remote plasma. In one or more embodiments, the plasmas include a hydrogen plasma and an oxygen plasma. The plasmas may be supplied sequentially in one or more embodiments. In other embodiments, the plasmas are supplied concurrently.

In one or more embodiments, exposing the substrate to a dual plasma treatment treats or cleans the substrate. In one or more embodiments, the substrate comprises at least one feature. The at least one feature may comprise any feature known to the skilled artisan, including, but not limited to a trench, a via, or a peak. In embodiments where exposing the substrate to a remote plasma and/or a direct plasma treats or cleans the substrate, the treating or cleaning removes one or more of a residue, e.g. from prior processing, and/or a native oxide.

Experiments showed that after substrate cleaning using both direct and remote plasma with $H_2$, $O_2$, and other gases, selective tungsten (W) deposition demonstrated lower selectivity loss defect counts. Experiments also demonstrated reduced growth from structure field and side wall (caused by selectivity loss) and achieved bottom-up growth. Experiments also achieved uniform, mild inside structure treatment, and achieved same treatment on field and sidewall/bottom.

FIG. 1 illustrates a contact structure used in accordance with one or more embodiments. The substrate 100 illustrated in FIG. 1 includes a structure 130 bounded by a first material 102 and a second material 104. The structure 130 comprising bottom 132 and sides 134 in the illustrated embodiment is a via or trench. The structure is bounded on the bottom 132 by the first material 102 and on the sides 134 by a second material 104 that is different than the first material 102. The first material 102 of some embodiments comprises a metal 110 which forms a metal bottom 115 of the structure. The metal 110 can be any suitable metal including, but not limited to, tungsten (W), cobalt (Co) and/or ruthenium (Ru). The first material 102 and the bottom 132 of the structure 130, in some embodiments, comprise a non-metal. Suitable non-metals include but are not limited to metal nitrides (e.g., titanium nitride (TiN)), metal silicides (e.g., titanium silicide (TiSi)) or silicon (Si). As used in this specification and the appended claims, unless otherwise specified by subscripts, chemical formulae are representative of the elemental identity and are not intended to imply any particular stoichiometric ratios. For example, a titanium nitride (TiN) film can have any suitable combination of titanium and nitrogen atoms and are not limited to a unity relationship.

In some embodiments, the second material 104 comprises a dielectric 120. The sidewalls 134 of the structure 130 are formed by the sidewalls 122 of the dielectric 120. The top surface 106 of the second material 104 is also referred to as the field. In some embodiments, the second material 104 comprises a dielectric 120 with sidewalls 122 and a field 124. The dielectric 120 can be any suitable material including, but not limited to, silicon oxide (SiO), silicon dioxide ($SiO_2$), silicon nitride (SiN), silicon oxynitride (SiON), aluminum nitride (AlN), aluminum oxide (AlO) or a high-k dielectric material. In some embodiments, the second material 104 comprises a hardmask material (e.g., carbon (C)).

Figure 2:
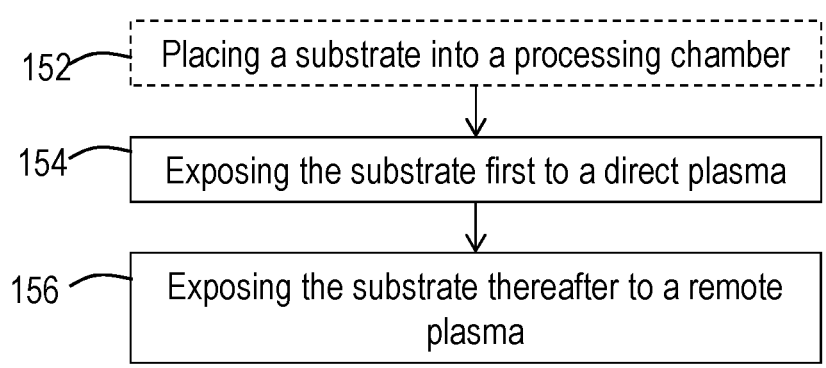
FIG. 2 illustrates a flowchart of a method in accordance with one or more embodiments of the disclosure.

FIG. 2 illustrates a method 150 in accordance with one or more embodiments for pre-cleaning a substrate prior to selective deposition. Surface contaminants of some embodiments comprise one or more of oxygen, nitrogen, carbon or halogen (e.g., fluorine, chlorine, bromine or iodine). In some embodiments, the contaminants comprise organic compounds.

At operation 152, a substrate is optionally placed into a processing chamber. At operation 154, the substrate is exposed to a direct plasma. At operation 156, the substrate is exposed to a remote plasma.

In one or more embodiments, dual plasma treatment comprises exposing the substrate to a direct plasma and thereafter to a remote plasma sequentially.

In an exemplary non-limiting embodiment, a cleaning process sequence comprises: (1) conducting a direct plasma treatment of a substrate in a processing chamber, where the plasma comprises hydrogen; (2) conducting a remote plasma treatment of a substrate in the processing chamber, where the plasma comprises oxygen. In an embodiment, after (1) and before (2), the cleaning process sequence further comprises conducting a direct plasma treatment of a substrate in a processing chamber, where the plasma comprises oxygen. In an embodiment, after (2), the cleaning process sequence further comprises conducting a remote plasma treatment of a substrate in a processing chamber, where the plasma comprises hydrogen. In an embodiment, after (2), the cleaning process sequence further comprises conducting a direct plasma treatment of a substrate in a processing chamber, where the plasma comprises hydrogen and thereafter conducting a remote plasma treatment of a substrate in a processing chamber, where the plasma comprises hydrogen.

In another exemplary non-limiting embodiment, a cleaning process sequence comprises conducting the following plasma treatments: (1) direct plasma of hydrogen; (2) direct plasma treatment of oxygen; (3) remote plasma of oxygen; (4) remote plasma of hydrogen. Optionally, between (3) and (4), a direct plasma of hydrogen is provided.

In an exemplary non-limiting embodiment, a cleaning process sequence comprises: (1) conducting a direct plasma treatment of a substrate in a processing chamber, where the plasma comprises hydrogen; (2) conducting a remote plasma treatment of a substrate in the processing chamber, where the plasma comprises hydrogen. Other embodiments may include, after (1) and before (2), the cleaning process sequence further comprises one or more of the following: a direct oxygen plasma; a remote oxygen plasma; a direct hydrogen plasma; a remote hydrogen plasma. In an embodiment, after (2), the cleaning process sequence further comprises one or more of the following: a direct oxygen plasma; a remote oxygen plasma; a direct hydrogen plasma; a remote hydrogen plasma.

In an exemplary non-limiting embodiment, a cleaning process sequence comprises: (1) conducting a direct plasma treatment of a substrate in a processing chamber, where the plasma comprises oxygen; (2) conducting a remote plasma treatment of a substrate in the processing chamber, where the plasma comprises oxygen. Other embodiments may include, after (1) and before (2), the cleaning process sequence further comprises one or more of the following: a direct oxygen plasma; a remote oxygen plasma; a direct hydrogen plasma; a remote hydrogen plasma. In an embodiment, after (2), the cleaning process sequence further comprises one or more of the following: a direct oxygen plasma; a remote oxygen plasma; a direct hydrogen plasma; a remote hydrogen plasma.

In another exemplary non-limiting embodiment, a cleaning process sequence comprises conducting the following plasma treatments: (1) co-flowing direct plasma of hydrogen and oxygen; and (2) co-flowing remote plasma of hydrogen and oxygen.

In some embodiments, the hydrogen ($H_2$) plasma is a capacitively-coupled plasma (CCP). In some embodiments, the $H_2$ plasma is a low energy plasma.

In one or more embodiments, the hydrogen plasma has a pressure in the range of 1 Torr to 30 Torr.

In some embodiments, the oxygen plasma is a capacitively-coupled plasma (CCP). In some embodiments, the oxygen ($O_2$) plasma is a high density, high energy plasma. In some embodiments, the low energy plasma has a power greater than or equal to 100 watts to less than or equal to 600 watts.

In one or more embodiments, the substrate is maintained at a temperature in the range of −20° C. to 500° C. during exposure to the oxygen plasma.

In some embodiments, the oxygen plasma has a pressure in the range of 1 Torr to 30 Torr.

After operation 156, the substrate may then be further processed for selective metal deposition. In one or more embodiments, after the cleaning process, the substrate is exposed to at least one precursor of a metal to selectively form a metal film on the substrate. In one or more embodiments, the method further comprises exposing the substrate to at least one precursor to deposit a film on the substrate vis a vis a plasma enhanced chemical vapor deposition (PECVD) process or a plasma enhanced atomic layer deposition process (PEALD). Any appropriate precursor known to the skill artisan may be used to form a film on the substrate.

In some embodiments, the pre-clean method illustrated in FIG. 2, efficiently cleans residues and enhances selectivity of a subsequent deposition process.

Various hardware arrangements can be used to implement the method 200. In some embodiments, for surface cleaning, one or two chambers can be applied to achieve multiple processes. Chambers can be used for $O_2/Ar/H_2$ plasma treatments with different gas species. $H_2$ and $O_2$ treatment in some embodiments are performed in one chamber.

Figure 3:
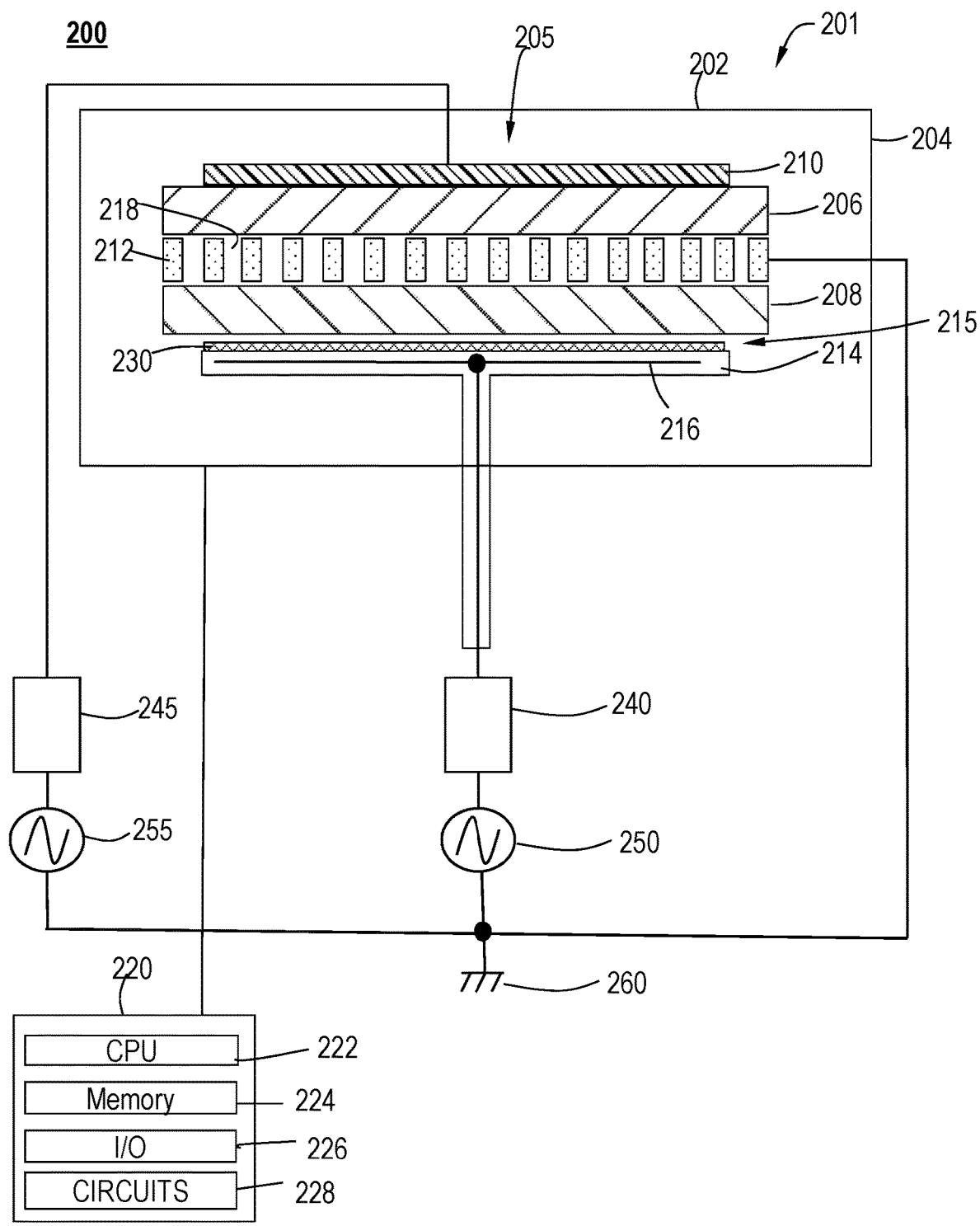
FIG. 3 illustrates a schematic diagram of a processing tool according to one or more embodiments of the disclosure.

FIG. 3 illustrates a processing tool 200 according to one or more embodiments. In one or more embodiments, the processing tool 200 comprising a processing chamber 201. The processing chamber comprises a lid 202 and at least one side wall 204. In one or more embodiments, the lid 202 and the at least one sidewall 204 define an internal volume 205 of the processing chamber 201. In one or more embodiments, the processing tool 200 comprises a remote plasma unit 206 within the internal volume 205 of the processing chamber 201. In one or more embodiments, a direct plasma unit 208 is within the internal volume 205 of the processing chamber 201. In one or more embodiments, one of the remote plasma unit 206 generates a remote plasma and the direct plasma unit 208 generates a direct plasma. In one or more embodiments, the generation of the remote plasma and the generation of the direct plasma occurs sequentially. In some embodiments, the generation of the remote plasma occurs first, and the generation of the direct plasma occurs thereafter. In other embodiments, the generation of the direct plasma occurs first and the generation of the remote plasma occurs thereafter. In one or more embodiments, the generation of the remote plasma and the generation of the direct plasma occurs simultaneously.

In one or more embodiments, an ion filter 212 separates the remote plasma unit 206 and the direct plasma unit 208. In one or more embodiments, the ion filter 212 is used to filter ions from the plasma effluents during transit from the remote plasma unit 206 to the substrate processing region 215. In one or more embodiments, the ion filter 212 functions to reduce or eliminate ionically charged species traveling from the remote plasma unit 206 to the substrate 230. In one or more embodiments, uncharged neutral and radical species may pass through at least one aperture 218 in the ion filter 212 to react at the substrate 230. It should be noted that complete elimination of ionically charged species in the reaction region 215 surrounding the substrate 230 is not always the desired goal. In one or more embodiments, ionic species are required to reach the substrate 230 in order to perform etch and/or deposition processes. In these instances, the ion filter 212 helps control the concentration of ionic species in the reaction region 215 at a level that assists the treat/clean and/or deposition process.

In one or more embodiments, the processing tool comprises at least one electrode within the processing chamber. In one or more embodiments, the at least one electrode is located within the internal volume 205 of the processing chamber 201. In the embodiment illustrated in FIG. 3, at least one electrode 210 is positioned in electrical communication with the remote plasma unit 206.

In one or more embodiments, the processing chamber 201 comprises a pedestal 214. In one or more embodiments, the pedestal 214 is configured to support a semiconductor substrate 230 in a processing region 215. In one or more embodiments, the pedestal 214 may have a heat exchange channel (not illustrated) through which a heat exchange fluid flows to control the temperature of the substrate 230. In one or more embodiments, the substrate 230 temperature can be cooled or heated to maintain relatively low temperatures, such as from about −20° C. to about 400° C. In one or more embodiments, the heat exchange fluid comprises one or more of ethylene glycol or water. In other embodiments, the pedestal 214 is resistively heated in order to achieve relatively high temperatures, such as from about 100° C. to about 1100° C., or from about 200° C. to about 750° C., through the use of an embedded resistive heater element (not illustrated). In one or more embodiments, the pedestal 214 is configured to rotate. In one or more embodiments, the pedestal 214 comprises an electrode 216 within the interior of the pedestal 214, and the pedestal 214 is powered by RF generator 250 and matched by RF match 240. In one or more embodiments, the pedestal 214 is comprised of a metallic material and is, itself, an electrode.

In one or more embodiments, at least one power source, e.g. RF generator, 250 is electrically connected via a first RF match 240 and a second RF match 245 to the processing chamber 201.

In one or more embodiments, two RF generators 250 are electrically connected to the processing chamber 201. In such embodiments, a first RF generator 250 is electrically connected to a pedestal electrode 216, and a second RF generator 255 is electrically connected to a top electrode 210.

In one or more embodiments, a plasma is generated using a radio frequency (RF) powered remote plasma unit 206 and/or direct plasma unit 208. In one or more embodiments, alternating current (AC) power is rectified and switched to provide current to a RF amplifier. The RF amplifier operates at a reference frequency (13.56 MHz, for example), drives current through an output-matching network, and then through a power measurement circuit to the output of the power supply. The output match is usually designed to be connected a generator that is optimized to drive particular impedance, such as, for example, 50 ohms, in order to have the same characteristic impedance as the coaxial cables commonly used in the industry. Power flows through the matched cable sections, is measured by the match controller, and is transformed through the load match. The load match is usually a motorized automatic tuner, so the load match operation incurs a predetermined time delay before the system is properly configured. After passing through the load match, power is then channeled into a plasma excitation circuit that drives two electrodes in an evacuated processing chamber. A processing gas is introduced into the evacuated processing chamber, and when driven by the circuit, plasma is generated. Since the matching network or the load match is motorized, the response time from the matching network is typically on the order of one second or more.

In some embodiments, the plasma power is in a range of from about 10 W to about 1000 W, including from about 200 W to about 600 W. In some embodiments, the plasma power is less than or equal to about 1000 W, or less than or equal to about 6500 W.

The plasma frequency may be any suitable frequency. In some embodiments, the plasma has a frequency in a range of about 200 kHz to 30 MHz. In some embodiments, the plasma frequency is less than or equal to about 20 MHz, less than or equal to about 10 MHz, less than or equal to about 5 MHz, less than or equal to about 1000 kHz, or less than or equal to about 500 kHz. In some embodiments, the plasma frequency is greater than or equal to about 210 kHz, greater than or equal to about 250 kHz, greater than or equal to about 600 kHz, greater than or equal to about 750 MHz, greater than or equal to about 1200 kHz, greater than or equal to about 2 MHz, greater than or equal to about 4 MHz, greater than or equal to about 7 MHz, greater than or equal to about 12 MHz, greater than or equal to about 15 MHz, or greater than or equal to about 25 MHz. In one or more embodiments, the plasma has a frequency of about 13.56 MHz, or about 350 kHz, or about 400 kHz, or about 27 MHz, or about 40 MHz, or about 60 MHz.

In one or more embodiments, a controller 220 may be provided and coupled to various components of the processing tool 200 to control the operation thereof. The controller 220 can be a single controller that controls the entire processing tool 200, or multiple controllers that control individual portions of the processing tool 200. For example, the processing tool 200 may include separate controllers for each of the processing chamber 202, remote plasma unit 206, direct plasma unit 208, and power source 250.

In some embodiments, the processing chamber 201 further comprises a controller 220. In one or more embodiments, the controller 220 controls the ignition of the plasma by the remote plasma unit 206 and/or the direct plasma unit 208 within the processing chamber 201.

In some embodiments, the controller 220 includes a central processing unit (CPU) 222, a memory 224, inputs/outputs (I/O) 226, and support circuits 228. The controller 220 may control the processing tool 200 directly, or via computers (or controllers) associated with particular process chamber and/or support system components.

The controller 220 may be one of any form of general-purpose computer processor that can be used in an industrial setting for controlling various chambers and sub-processors. The memory 224 or computer readable medium of the controller 220 may be one or more of readily available memory such as non-transitory memory (e.g. random access memory (RAM)), read only memory (ROM), floppy disk, hard disk, optical storage media (e.g., compact disc or digital video disc), flash drive, or any other form of digital storage, local or remote. The memory 224 can retain an instruction set that is operable by the processor (CPU 222) to control parameters and components of the processing tool 200.

The support circuits 228 are coupled to the CPU 222 for supporting the processor in a conventional manner. These circuits include cache, power supplies, clock circuits, input/output circuitry and subsystems, and the like. One or more processes may be stored in the memory 224 as software routine that, when executed or invoked by the processor, causes the processor to control the operation of the processing tool 200 or individual processing units (e.g. remote plasma unit 206 and direct plasma unit 208) in the manner described herein. The software routine may also be stored and/or executed by a second CPU (not shown) that is remotely located from the hardware being controlled by the CPU 222.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 220 has one or more configurations to execute individual processes or sub-processes to perform the method. The controller 220 can be connected to and configured to operate intermediate components to perform the functions of the methods. For example, the controller 220 can be connected to and configured to control one or more of the remote plasma unit 206, the direct plasma unit 208, the pedestal 214, the at least one electrode, or other components.

Figure 4:
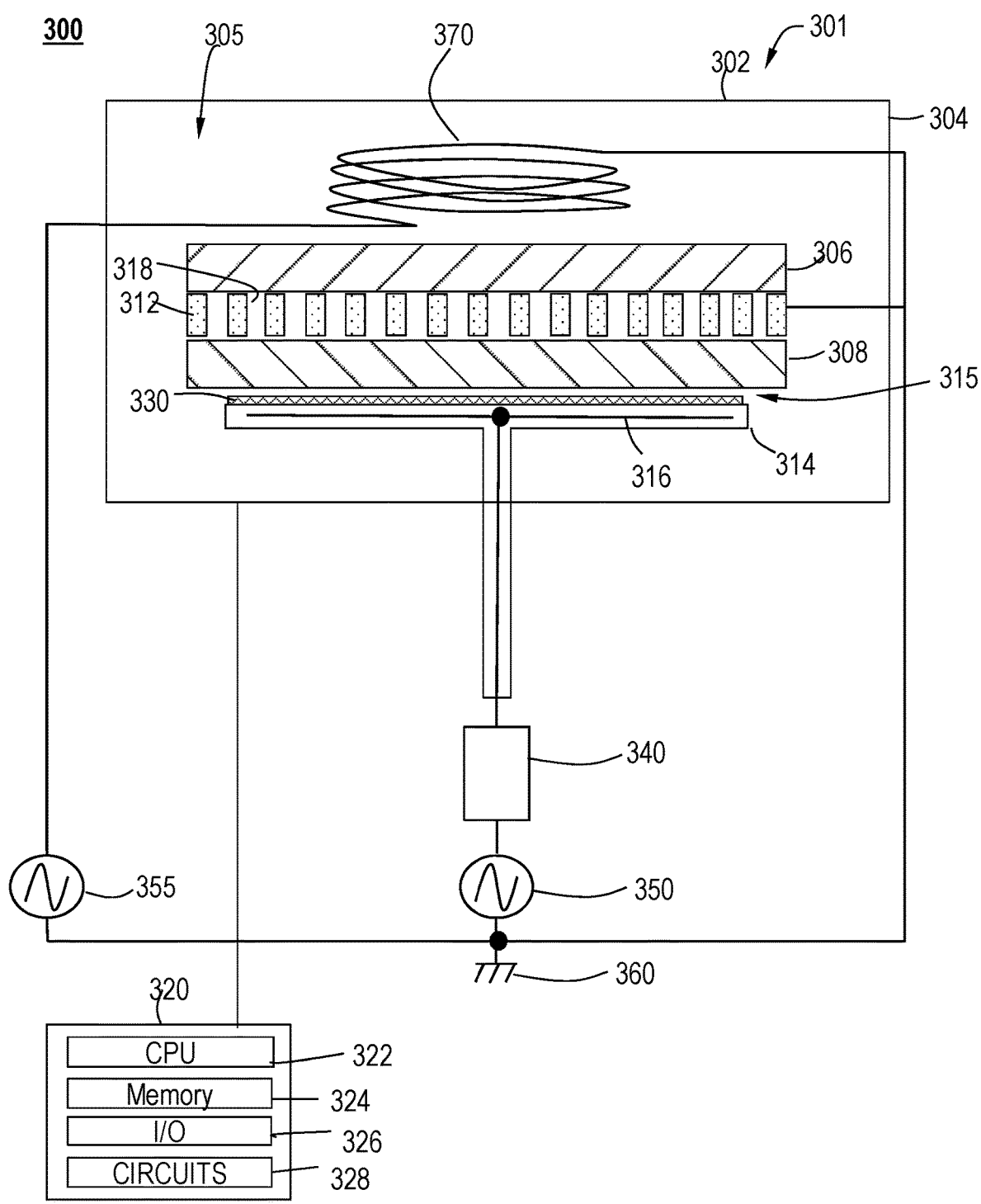
FIG. 4 illustrates a schematic diagram of a processing tool according to one or more embodiments of the disclosure.

FIG. 4 illustrates a processing tool 300 according to one or more embodiments. In one or more embodiments, the processing tool 300 comprises a processing chamber 301. The processing chamber comprises a lid 302 and at least one side wall 304. In one or more embodiments, the lid 302 and the at least one sidewall 304 define an internal volume 305 of the processing chamber 301. In one or more embodiments, the processing tool 300 comprises a remote plasma unit 306 within the internal volume 305 of the processing chamber 301. In one or more embodiments, a direct plasma unit 308 is within the internal volume 305 of the processing chamber 301. In one or more embodiments, one of the remote plasma unit 306 generates a remote plasma and the direct plasma unit 308 generates a direct plasma. In one or more embodiments, the generation of the remote plasma and the generation of the direct plasma occurs sequentially. In some embodiments, the generation of the remote plasma occurs first, and the generation of the direct plasma occurs thereafter. In other embodiments, the generation of the direct plasma occurs first and the generation of the remote plasma occurs thereafter. In one or more embodiments, the generation of the remote plasma and the generation of the direct plasma occur simultaneously.

In one or more embodiments, an ion filter 312 separates the remote plasma unit 306 and the direct plasma unit 308. In one or more embodiments, the ion filter 312 is used to filter ions from the plasma effluents during transit from the remote plasma unit 306 to the substrate processing region 315. In one or more embodiments, the ion filter 312 functions to reduce or eliminate ionically charged species traveling from the remote plasma unit 306 to the substrate 330. In one or more embodiments, uncharged neutral and radical species may pass through at least one aperture 318 in the ion filter 312 to react at the substrate 330. It should be noted that complete elimination of ionically charged species in the reaction region 315 surrounding the substrate 330 is not always the desired goal. In one or more embodiments, ionic species are required to reach the substrate 330 in order to perform etch and/or deposition processes. In these instances, the ion filter 312 helps control the concentration of ionic species in the reaction region 315 at a level that assists the treat/clean and/or deposition process.

In one or more embodiments, the ion filter 312 comprises a showerhead.

In one or more embodiments, the processing tool comprises at least one electrode within the processing chamber. In one or more embodiments, the at least one electrode is located within the internal volume 305 of the processing chamber 301. In the embodiment illustrated in FIG. 4, at least one electrode 316 is positioned in electrical communication with the pedestal 314.

In one or more embodiments, the processing chamber 301 comprises a pedestal 314. In one or more embodiments, the pedestal 314 is configured to support a semiconductor substrate 330 in a processing region 315. In one or more embodiments, the pedestal 314 may have a heat exchange channel (not illustrated) through which a heat exchange fluid flows to control the temperature of the substrate 330. In one or more embodiments, the substrate 330 temperature can be cooled or heated to maintain relatively low temperatures, such as from about −20° C. to about 400° C., or from about 0 t to about 400° C. In one or more embodiments, the heat exchange fluid comprises one or more of ethylene glycol or water. In other embodiments, the pedestal 314 is resistively heated in order to achieve relatively high temperatures, such as from about 100° C. to about 1100° C., or from about 200° C. to about 750° C., through the use of an embedded resistive heater element (not illustrated). In one or more embodiments, the pedestal 314 is configured to rotate. In one or more embodiments, the pedestal 314 comprises an electrode 316 within the interior of the pedestal 314, and the pedestal 314 is powered by RF generator 350 and matched by RF match 340. In one or more embodiments, the pedestal 314 is comprised of a metallic material and is, itself, an electrode.

In one or more embodiments, at least one power source, e.g. RF generator, 350 is electrically connected via an RF match 340 to the processing chamber 301.

In one or more embodiments, two RF generators are electrically connected to the processing chamber 301. In such embodiments, a first RF generator 350 is electrically connected to a pedestal electrode 316, and a second RF generator 355 is electrically connected to an inductively coupled plasma (ICP) coil 370.

In one or more embodiments, a plasma is generated using a radio frequency (RF) powered remote plasma unit 306 and direct plasma unit 308. In one or more embodiments, alternating current (AC) power is rectified and switched to provide current to a RF amplifier. The RF amplifier operates at a reference frequency (13.56 MHz, for example), drives current through an output-matching network, and then through a power measurement circuit to the output of the power supply. The output match is usually designed to be connected a generator that is optimized to drive particular impedance, such as, for example, 50 ohms, in order to have the same characteristic impedance as the coaxial cables commonly used in the industry. Power flows through the matched cable sections, is measured by the match controller, and is transformed through the load match. The load match is usually a motorized automatic tuner, so the load match operation incurs a predetermined time delay before the system is properly configured. After passing through the load match, power is then channeled into a plasma excitation circuit that drives two electrodes in an evacuated processing chamber. A processing gas is introduced into the evacuated processing chamber, and when driven by the circuit, plasma is generated. Since the matching network or the load match is motorized, the response time from the matching network is typically on the order of one second or more.

In some embodiments, the plasma power is in a range of about 10 W to about 1000 W, including from about 200 W to about 600 W. In some embodiments, the plasma power is less than or equal to about 1000 W, or less than or equal to about 6500 W.

The plasma frequency may be any suitable frequency. In some embodiments, the plasma has a frequency in a range of about 200 kHz to 30 MHz. In some embodiments, the plasma frequency is less than or equal to about 20 MHz, less than or equal to about 10 MHz, less than or equal to about 5 MHz, less than or equal to about 1000 kHz, or less than or equal to about 500 kHz. In some embodiments, the plasma frequency is greater than or equal to about 210 kHz, greater than or equal to about 250 kHz, greater than or equal to about 600 kHz, greater than or equal to about 750 MHz, greater than or equal to about 1200 kHz, greater than or equal to about 2 MHz, greater than or equal to about 4 MHz, greater than or equal to about 7 MHz, greater than or equal to about 12 MHz, greater than or equal to about 15 MHz, or greater than or equal to about 25 MHz. In one or more embodiments, the plasma has a frequency of about 13.56 MHz, or about 350 kHz, or about 400 kHz, or about 27 MHz, or about 40 MHz, or about 60 MHz.

In one or more embodiments, a controller 320 may be provided and coupled to various components of the processing tool 300 to control the operation thereof. The controller 320 can be a single controller that controls the entire processing tool 300, or multiple controllers that control individual portions of the processing tool 300. For example, the processing tool 300 may include separate controllers for each of the processing chamber 301, remote plasma unit 306, direct plasma unit 308, and power source 350.

In some embodiments, the processing chamber 301 further comprises a controller 320. In one or more embodiments, the controller 320 controls the ignition of the plasma by the remote plasma unit 306 and/or the direct plasma unit 308 within the processing chamber 301.

In some embodiments, the controller 320 includes a central processing unit (CPU) 322, a memory 324, inputs/outputs (I/O) 326, and support circuits 328. The controller 320 may control the processing tool 300 directly, or via computers (or controllers) associated with particular process chamber and/or support system components.

The controller 320 may be one of any form of general-purpose computer processor that can be used in an industrial setting for controlling various chambers and sub-processors. The memory 324 or computer readable medium of the controller 320 may be one or more of readily available memory such as non-transitory memory (e.g. random access memory (RAM)), read only memory (ROM), floppy disk, hard disk, optical storage media (e.g., compact disc or digital video disc), flash drive, or any other form of digital storage, local or remote. The memory 324 can retain an instruction set that is operable by the processor (CPU 322) to control parameters and components of the processing tool 300.

The support circuits 328 are coupled to the CPU 322 for supporting the processor in a conventional manner. These circuits include cache, power supplies, clock circuits, input/output circuitry and subsystems, and the like. One or more processes may be stored in the memory 324 as software routine that, when executed or invoked by the processor, causes the processor to control the operation of the processing tool 300 or individual processing units (e.g. remote plasma unit 306 and direct plasma unit 308) in the manner described herein. The software routine may also be stored and/or executed by a second CPU (not shown) that is remotely located from the hardware being controlled by the CPU 322.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 320 has one or more configurations to execute individual processes or sub-processes to perform the method. The controller 320 can be connected to and configured to operate intermediate components to perform the functions of the methods. For example, the controller 320 can be connected to and configured to control one or more of the remote plasma unit 306, the direct plasma unit 308, the pedestal 314, the at least one electrode 316, the ICP coil 370, or other components.

Additional embodiments of the disclosure are directed to a processing system having one or more processing chambers. A processing chamber of the system includes a cooled pedestal. In one or more embodiments, the processing chamber including a processing tool of either FIG. 3 or FIG. 4.

One or more embodiments are directed to a non-transitory computer readable medium including instructions, that, when executed by a controller of a processing chamber, cause the processing chamber to perform the operations of exposing a substrate comprising a surface structure with a metal bottom, dielectric sidewalls, and a field of dielectric to a dual plasma treatment in a processing chamber to remove chemical residual and/or impurities from the metal bottom, the dielectric sidewalls, and/or the field of the dielectric and/or repair surface defects in the dielectric sidewalls and/or the field of the dielectric; wherein the dual plasma treatment comprises a direct plasma followed by a remote plasma.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a semiconductor, the method comprising:
   exposing a substrate comprising a surface structure with a metal bottom, dielectric sidewalls, and a field of dielectric to a dual plasma treatment in a processing chamber to remove chemical residual and/or impurities from the metal bottom, the dielectric sidewalls, and/or the field of the dielectric and/or repair surface defects in the dielectric sidewalls and/or the field of the dielectric; and exposing the substrate to a tungsten precursor to selectively form a tungsten film on the substrate, the tungsten film forming selectively on the metal bottom relative to the dielectric sidewalls and the field of dielectric, wherein the metal bottom comprises one or more of tungsten (W), cobalt (Co), or ruthenium (Ru), wherein the processing chamber comprises a dual plasma lid performing the dual plasma treatment, wherein the processing chamber comprises at least one side wall defining an internal volume, the internal volume comprising a remote plasma unit and a direct plasma unit, and wherein the dual plasma treatment comprises simultaneously or sequentially exposing the surface structure to a direct plasma generated by the direct plasma unit and to a remote plasma generated by the remote plasma unit, the direct plasma comprising one or more of a direct oxygen plasma and a direct hydrogen plasma, and the remote plasma comprising one or more of a remote oxygen plasma and a remote hydrogen plasma.

2. The method of claim 1, wherein the direct plasma comprises the direct hydrogen plasma, and the remote plasma comprises the remote oxygen plasma.

3. The method of claim 1, wherein the direct plasma comprises the direct oxygen plasma, and the remote plasma comprises the remote hydrogen plasma.

4. The method of claim 1, wherein the direct plasma comprises the direct oxygen plasma, and the remote plasma comprises the remote oxygen plasma.

5. The method of claim 1, wherein the direct plasma comprises the direct hydrogen plasma, and the remote plasma comprises the remote hydrogen plasma.

6. The method of claim 1, wherein the dielectric comprises one or more of silicon nitride (SiN), silicon oxide (SiO), silicon oxynitride (SiON), or a high-k dielectric.

7. The method of claim 1, wherein the dielectric comprises silicon oxide (SiO), silicon nitride (SiN), and/or silicon oxynitride (SiON), and the metal comprises tungsten (W).

8. The method of claim 2, wherein the substrate is exposed to the direct hydrogen plasma before the remote oxygen plasma.

9. The method of claim 4, wherein the substrate is exposed to the direct oxygen plasma before the remote hydrogen plasma.

* * * * *